US 12,189,630 B2

(12) United States Patent
Luo et al.

(10) Patent No.: US 12,189,630 B2
(45) Date of Patent: Jan. 7, 2025

(54) COMPRESSION, SEARCHING, AND DECOMPRESSION OF LOG MESSAGES

(71) Applicant: YSCOPE INC., Toronto (CA)

(72) Inventors: Yu Luo, Toronto (CA); Kirk Rodrigues, Scarborough (CA); Ding Yuan, Toronto (CA)

(73) Assignee: YSCOPE INC., Toronto (CA)

( * ) Notice: Subject to any disclaimer, the term of this patent is extended or adjusted under 35 U.S.C. 154(b) by 183 days.

(21) Appl. No.: 18/112,777

(22) Filed: Feb. 22, 2023

(65) Prior Publication Data
US 2023/0244667 A1    Aug. 3, 2023

Related U.S. Application Data

(62) Division of application No. 17/097,550, filed on Nov. 13, 2020, now Pat. No. 11,593,373.
(Continued)

(51) Int. Cl.
*H03M 7/00*      (2006.01)
*G06F 16/22*     (2019.01)
(Continued)

(52) U.S. Cl.
CPC .... *G06F 16/24549* (2019.01); *G06F 16/2255* (2019.01); *G06F 16/2272* (2019.01); *G06F 16/2282* (2019.01); *H03M 7/3088* (2013.01)

(58) Field of Classification Search
CPC ............. G06F 11/3476; G06F 11/3636; G06F 11/323; G06F 11/3466; G06F 11/3612; G06F 17/40; G06F 2201/865; G06F 11/0709; G06F 11/079; G06F 11/2257; G06F 11/302; G06F 11/3037; G06F 11/3068; G06F 11/3072; G06F 11/3075; G06F 11/3419; G06F 11/3447; G06F 11/3604; G06F 11/3608; G06F 11/3624; G06F 16/1734; G06F 16/174; G06F 16/1744; G06F 16/2272; G06F 16/2465; G06F 16/901; G06F 16/9024; G06F 16/9027; G06F 16/90344; G06F 16/904;
(Continued)

(56) References Cited

U.S. PATENT DOCUMENTS 7,725,298 B2 *   5/2010   Levine ................ G06F 11/3466
                                                        702/182
7,778,979 B2 *   8/2010   Hatonen ............. G06F 11/3466
                                                        707/693
(Continued)

*Primary Examiner* — Linh V Nguyen
(74) *Attorney, Agent, or Firm* — Perry + Currier

(57) ABSTRACT

Log messages are compressed, searched, and decompressed. A dictionary is used to store non-numeric expressions found in log messages. Both numeric and non-numeric expressions found in log messages are represented by placeholders in a string of log "type" information. Another dictionary is used to store the log type information. A compressed log message contains a key to the log-type dictionary and a sequence of values that are keys to the non-numeric dictionary and/or numeric values. Searching may be performed by parsing a search query into subqueries that target the dictionaries and/or content of the compressed log messages. A dictionary may reference segments that contain a number of log messages, so that all log message need not be considered for some searches.

6 Claims, 14 Drawing Sheets

Related U.S. Application Data

(60) Provisional application No. 62/935,094, filed on Nov. 14, 2019.

(51) Int. Cl.
   *G06F 16/2453* (2019.01)
   *H03M 7/30* (2006.01)

(58) Field of Classification Search
   CPC ........... G06F 21/552; G06F 2221/2101; G06F 3/0608; G06F 3/0652; G06F 3/0653; G06F 3/0679; G06F 8/427; G06F 8/443; G06F 8/75; H03M 7/3071; H03M 7/607; H03M 7/70
   USPC .............................. 341/51, 87, 94, 106, 107
   See application file for complete search history.

(56) References Cited

U.S. PATENT DOCUMENTS

| | | | | |
|---|---|---|---|---|
| 9,619,478 | B1* | 4/2017 | Singh | G06F 11/3476 |
| 11,126,531 | B2* | 9/2021 | Savir | G06F 16/90344 |
| 11,144,506 | B2* | 10/2021 | Natanzon | H03M 7/607 |
| 11,151,089 | B2* | 10/2021 | Savir | G06N 20/00 |
| 11,341,024 | B2* | 5/2022 | Ross | G06F 16/9027 |
| 12,028,206 | B2* | 7/2024 | Li | H04L 41/069 |
| 2005/0240582 | A1* | 10/2005 | Hatonen | G06F 16/2465 |

\* cited by examiner

| Search phrase | Subqueries | Composition |
|---|---|---|
| " user " | SQ1: log type: " user " | SQ1 |
| " INFO * by user " | SQ1: log type: " INFO * by user " | SQ1 |
| "job*" | SQ1: log type: "job*"<br>SQ2: non-numeric: "job*" | SQ1 or SQ2 |
| "completion time:12.*" | SQ1: log type: "completion time:"<br>SQ2: non-numeric: "12.*"<br>SQ3: floating-point: "12.*" | SQ1 and (SQ2 or SQ3) |
| "12*" | SQ1: non-numeric: "12*"<br>SQ2: integer: "12*"<br>SQ3: floating-point: "12*" | SQ1 or SQ2 or SQ3 |

FIG. 8

| Name | # files | # messages | Size on disk (GB) |
|---|---|---|---|
| hadoop-30GB | 3,225 | 109,860,493 | 29.50 |
| openstack-24hrs | 810 | 74,188,154 | 33.00 |
| hadoop-258GB | 337 | 945,729,428 | 257.25 |
| hadoop-14TB | 18,170 | 57,323,941,112 | 14,510 |

| Dataset | % of raw size | | | Elasticsearch/PRESENT |
|---|---|---|---|---|
| | Elasticsearch | gzip | PRESENT | |
| hadoop-30GB | 23.07% | 4.44% | 3.54% | 6.5x |
| openstack-24hrs | 49.40% | 6.23% | 3.95% | 12.5x |
| hadoop-258GB | 41.31% | 4.74% | 2.53% | 16.3x |
| hadoop-14TB | — | 5.80% | 2.30% | — |
| Average | 37.93% | 5.30% | 3.08% | 11.8x |

| # | Query | # results | Elasticsearch | best search runtime (s) PRESENT,nocache | PRESENT,cache |
|---|---|---|---|---|---|
| 1 | "INFO org.apache.hadoop.yarn.server. nodemanager.containermanager. container.ContainerImpl: Container" | 513,893 | 42.78 | 11.25 (3.8x) | 1.09 (39.2x) |
| 2 | "DEBUG org.apache.hadoop.mapred. ShuffleHandler: verifying request. enc_str=" | 810,033 | 44.94 | 16.86 (2.7x) | 2.07 (21.7x) |
| 3 | "10 reply:" | 279,284 | 226.04 | 89.30 (2.5x) | -- |
| 4 | "1.9 GB" | 1,623,002 | 55.11 | 33.46 (1.6x) | -- |
| 5 | "178.2 MB" | 2,800 | 9.79 | 7.97 (1.2x) | -- |
| 6 | "abcde" | 0 | 0.43 | 0.51 (0.8x) | -- |
| 7 | "10000 reply:" | 13,064 | 56.74 | 86.63 (0.7x) | -- |
| 8 | "org.apache.hadoop.hdfs.server. datanode.DataNode: DataTransfer: at" | 2,026 | 20.06 | 80.23 (0.2x) | 0.26 (77.1x) |
| 9 | "to pid 21177 as user" | 12 | 1.78 | 7.88 (0.2x) | 0.58 (3.1x) |
| 10 | "org.apache.hadoop.hdfs.server.common.Storage: Analyzing storage directories for bpid" | 12 | 1.83 | 8.23 (0.2x) | 0.25 (7.3x) |

COMPRESSION, SEARCHING, AND DECOMPRESSION OF LOG MESSAGES

CROSS-REFERENCE TO RELATED APPLICATION

This application claims the benefit of U.S. provisional application Ser. No. 62/935,094, filed Nov. 14, 2019, which is incorporated herein by reference.

BACKGROUND

Technology companies today can generate petabytes of logs per day. Such log data may be analyzed for a variety of tasks, including failure diagnosis, intrusion detection, security forensics, obtaining business insights, trend analysis, and resource optimization. For example, when computer systems experience errors or security intrusions, logs are often the main or only source of information available for engineers to search for a root cause.

SUMMARY

According to an aspect of this disclosure, a non-transitory computer-readable medium includes instructions to tokenize a log message into a sequence of tokens using a delimiter and parse the sequence of tokens to discriminate between numeric variables and dictionary variables. The parsing includes identifying a token as a numeric expression of a variable if the token conforms to a numeric schema and identifying the token as a non-numeric expression of a variable if the token fails to conform to the numeric schema. The instructions are further to assign a key to an identified non-numeric expression, where the key correlated to the identified non-numeric expression by a non-numeric expression dictionary, and store a compressed log message as the key to the identified non-numeric expression and any identified numeric expression arranged in an order defined by the sequence of tokens.

According to another aspect of this disclosure, a non-transitory computer-readable medium includes instructions to receive a query to search a plurality of compressed log messages and generate subqueries based on the query. Each of the subqueries is a non-numeric expression subquery that is executable on a non-numeric expression dictionary that stores non-numeric expressions of variables, a log-type subquery that is executable on a log-type dictionary that stores log information that excludes expressions of variables and numeric values, or a numeric subquery that is executable on the plurality of compressed log messages that reference the log-type dictionary. The instructions are further to execute the subqueries and output a collection of results of the execution of the subqueries.

According to another aspect of this disclosure, a non-transitory computer-readable medium includes instructions to parse a compressed log message to discriminate between numeric values and dictionary keys. The parsing includes identifying a numeric value as a value outside a range of reserved values and identifying a key as a value within the range of reserved values. The instructions are further to lookup an identified key in a non-numeric expression dictionary to obtain a non-numeric expression of a variable and output a decompressed log message as the non-numeric expression with any identified numeric value.

BRIEF DESCRIPTION OF THE DRAWINGS

FIG. 8 is table showing example search phrases, subqueries, and compositions of subqueries.

FIG. 17 is a table showing tested search queries and query times.

DETAILED DESCRIPTION

Figure 1:
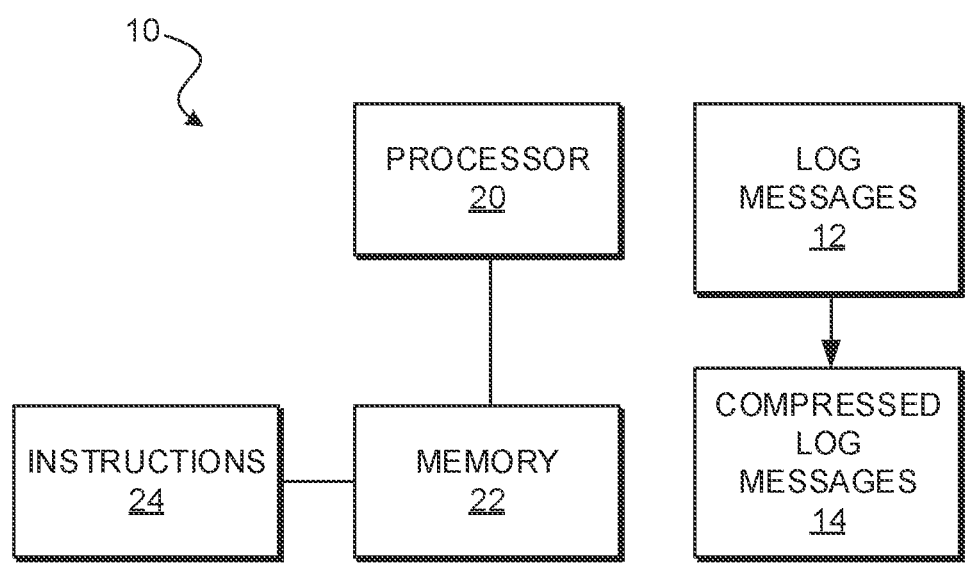
FIG. 1 is a block diagram of a system for processing log messages.

The large quantity of log information poses significant challenges. First, storing the logs can be resource intensive and costly. It has been estimated that a lower bound for capital depreciation and operational costs for log storage could be on the order of two cents per gigabyte per month, Annamalai et al. "Sharding the shards: Managing datastore locality at scale with akkio"; 13th USENIX Symposium on Operating Systems Design and Implementation (OSDI 18) (Carlsbad, CA, October 2018), USENIX Association, pp. 445-460. For a company generating one petabyte of logs per day, this could translate into $92 million per year to retain the logs generated in one year.

In addition, searching a large quantity of logs also requires a large amount of computing resources. Various conventional log search solutions operate by computing an index of the logs and performing searches on the index. The size of the index is on the same order of magnitude of the log size, therefore using such tools require a comparable amount of resources. Users of these solutions may therefore choose to adopt a log retention period of, for example, two weeks. Logs that are older than this period will be removed and have their indices deleted. This means that such tools are generally only useful for log searching during a defined and relatively short retention period.

Further, it is often the case that general-purpose compression tools, such as gzip, are used to compress the logs in order to save space. However, the users cannot search and analyze the compressed logs, as the logs must first be decompressed. Decompressing a large amount of log data tends to be slow. In addition, searching that operates on uncompressed logs consumes a relatively large amount of computing resources. Therefore, in practice, once logs are compressed (e.g., using gzip), it becomes difficult and impractical to analyze them again.

Various known solutions to these problems require access to the program, executable or source code, that generated the logs. For example, one type of compression algorithm analyzes source code and builds a model of log messages, particularly with regard to variable and static text, and uses the model to compress log messages. However, it is often the case that the party that operates the program is unwilling or unable to provide it to the party that provides log storage solutions. This may be the case for a variety of reasons, such as security, commercial concerns, and complexity, in that programs that generate large amounts of log data are often a complex network of interworking programs rather than a single file.

The techniques described herein provide for efficient compression, search, and decompression of log messages based on log message content and without requiring access to the program or programs that generated the log messages. The compression is lossless, i.e., a decompressed log message is identical to the original log message. Further, the techniques described herein provide for searching log data without decompression.

Expressions of variable values and static text are identified in a log message. Separate dictionaries may be used to store variable values, particularly non-numeric expressions, and static text. Each compressed log message may include an identifier/key for its static text, a list of identifiers/keys for its variable values, a timestamp, and other encoded variable values (e.g., numeric values). Each key is an index into the static text dictionary or variable value dictionary.

The techniques described herein provide various advantages over conventional techniques. Storage space may be saved. Compressed log messages may require as low as 2.3% of the storage space required for the original log messages.

Searching may be more efficient because searches can be performed directly on compressed log messages without decompression. The significantly smaller compressed log size translates to significantly more efficient search performance. Search speed can be as fast as 100-1000 times faster than searching original raw logs.

Expressive search operators are possible. The techniques described herein support complex queries such as regular expressions (regex), group-by, count, searching logs in a specific time range, running a pipeline of commands (e.g., regex|group-by|count).

Further, the techniques discussed herein support Application Programming Interfaces (APIs). Users can run any custom log analysis programs by querying an API. As such, a wide range of log analyses may be performed.

FIG. 1 shows an example system 10 configured to compress log messages 12 to generate compressed log messages 14. The system 10 may also store compressed log messages 14 and provide for searching compressed log messages 14. Raw log messages 12 may be deleted after being compressed. The compression is lossless, as will be discussed further herein.

The system 10 may include a processor 20, memory 22, and instructions 24 resident on a computing device, such as a server. A group of interconnected servers may be used, such as a server cluster. The system 10 may be implemented by a distributed computer network, which is sometimes referred to as "the cloud."

The processor 20 may include a central processing unit (CPU), a microcontroller, a microprocessor, a processing core, a processor, a field-programmable gate array (FPGA), an application-specific integrated circuit (ASIC), or a similar device capable of executing instructions. The processor 20 may cooperate with a memory 22 implemented by a non-transitory computer-readable medium that may be an electronic, magnetic, optical, or other physical storage device that encodes instructions 24. The computer-readable medium may include, for example, random access memory (RAM), read-only memory (ROM), electrically-erasable programmable read-only memory (EEPROM), flash memory, a storage drive, an optical device, or similar.

The instructions 24 are executable or may be interpreted to generate instructions that are executable by the processor 20. The instructions 24 may implement the techniques discussed herein, such as compression, search, and decompression of log messages.

Log messages may be generated by a program for various reasons. Log messages are often stored in files, such as text files. An example log file stores a series of log messages, one message per line of the file. Numerous other examples exist, such as log messages that span multiple lines. An example snippet of a log file is given below:

2018-07-24 06:32:11.995 INFO File Upload job_6368 file uploaded by user user3994, file-ID: 34D0058

2018-07-24 06:33:43.151 INFO Job job_2936 submitted by user admin128 is completed, job completion time: 12.863 second 2018-07-24 06:33:52.003, user admin128 logs out The below example log message from this snippet will be referenced in various examples discussed herein:

2018-07-24 06:33:43.151 INFO Job job_2936 submitted by user admin128 is completed, job completion time: 12.863 second The techniques discussed herein operate on the log messages themselves and do not require access to the program that generated the log messages or its source code. That is, raw log data is processed without advanced knowledge of the format or content of the log messages.

Figure 2:
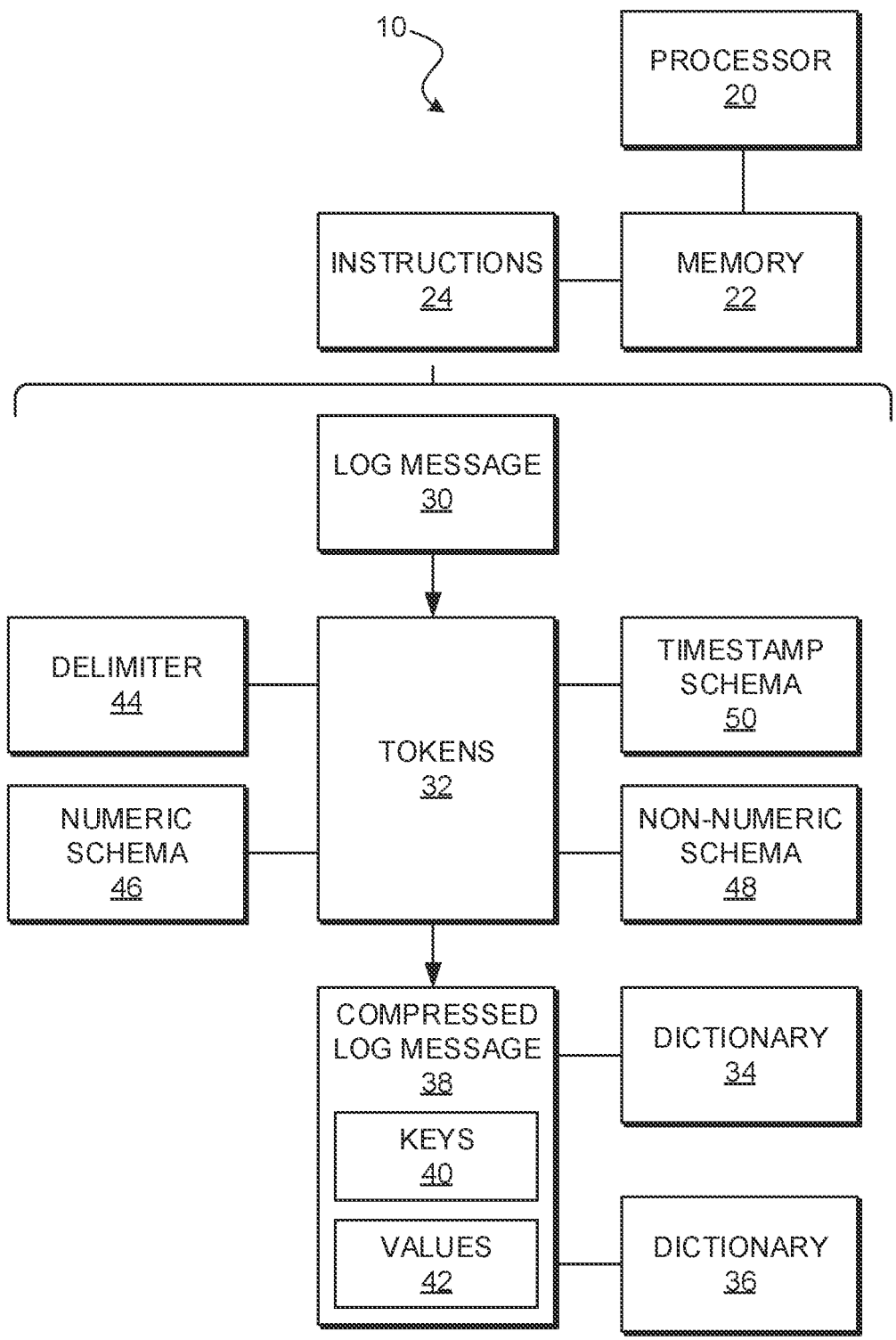
FIG. 2 is a block diagram of a system for compressing log messages.

With reference to FIG. 2, compression is performed by tokenizing a log message 30 to obtain a set of tokens 32 and populating and/or referencing a dictionary 34, 36. Multiple different dictionaries 34, 36 may be used. A compressed log message 38 includes keys 40 to the dictionaries 34, 36 as well as values 42 from tokens 32 that are not stored in a dictionary 34, 36. Examples of values 42 include a representation of a timestamp from the original log message 30 and numeric values contained in the original log message 30.

The dictionaries 34, 36 may include a non-numeric expression dictionary 34 and a log-type dictionary 36. It is contemplated that static text typically occupies most of the space in log messages yet is highly repetitive, whereas expressions of variables are generally less repetitive and smaller. As such, the dictionaries identify and separate these components of each log message. Further, since many log messages include timestamps, identification and separation of timestamps can also increase efficiency, particularly when such timestamps are converted from text to a numeric format.

A timestamp may be identified by parsing the log message 30 to compare characters of the log message 30 to a plurality of different timestamp schemas 50. The timestamp may then be converted into an integer timestamp for storage as a value 42 in the compressed log message 38. The integer timestamp may be a Unix epoch timestamp. The timestamp may be stored with a fixed size, such as 64 bits. Various different timestamp schemas may be tested against a set of log messages. A timestamp schema may be user-configurable, so that a particular expected timestamp format may be found.

In the example log message above, "2018-07-24 06:33:43.151" is a timestamp that may be converted to "1532414023151", which is the Unix epoch time in milliseconds.

Timestamps may be used to delimit log messages 30 from one another. That is, a timestamp may be used to isolate individual log messages 30 from a series of log messages 30, as may be stored in a file. A timestamp may be expected to start each log message 30. This may be made configurable by, for example, a user option to indicate that timestamps are located at an end of a log message 30. In addition, if timestamps are not detected, then a newline character may be used to delimit log messages 30.

Tokenization may be performed using a delimiter 44 (e.g., a single delimiter or set of delimiters). An example set of delimiters includes any character except for the following:
1. Letters from "a" to "z" and "A" to "Z";
2. Digits "0" to "9"; and
3. The characters "+", "−", ".", "/", or "\".

That is, a set of delimiters 44 may be all ASCII characters except for the above. The example log message above therefore contains the following delimiters: " " (white space), "_", ",", and ":". As such, the example log message may be split into the following tokens (not including the delimiters and the timestamp):
INFO
Job
job
2936
submitted
by
user
admin128
is
completed
job
completion
time
12.863
second In various examples, a non-numeric expression dictionary 34 is used to store non-numeric expressions of variables used by a program that generated the log messages 30. It is contemplated that many programs express variables, whether numeric or not, as non-numeric expressions, particularly in log messages, for sake of readability. A non-numeric variable expression (or value) may include alphabetic characters, a combination of alphabetic characters and numeric characters, or other forms that do not appear as an ordinary number. An integer with leading zeroes may also be considered a non-numeric expression. Examples of non-numeric expressions of variables include "+23", "00232", "user123", and "−23.−3". A non-numeric expression key 40 to the non-numeric expression dictionary 34 may be stored in a compressed log message 38.

On the other hand, ordinary numbers that appear in log messages are not stored in a dictionary 34, 36 but are stored in the compressed log messages as values 42. It is contemplated that an ordinary number expressed in a log message carries a unique or unpredictable value and is therefore not worthwhile to consider for dictionary compression. An ordinary number is a token that conforms to a numeric schema 46.

An example numeric schema 46 defines an integer as a contiguous series of one or more numeric digits (0-9), with or without a leading negative sign ("−") and without leading zeroes (zero padding). For example, token "2936" from the example log message is recognized as an integer expression. All of the other tokens of this example log message are not integer expressions. As another example, "−23" is also an integer expression. Examples of non-integer expressions include "+23" (because it has a preceding plus sign), "00232" (because it is zero-padded), and "user123" (because it contains alphabetic characters).

The numeric schema 46 may further define a floating-point number as a contiguous series of one or more numeric digits (0-9) and a decimal point ("."), with or without a leading negative sign ("−"). The numeric schema 46 may also place a limit on the number of digits in a floating-point number, such as fewer than 15 digits. Examples of floating-point expressions include "12.863" and "−352.00". Examples of non-floating-point expressions include "1.123456789123456" and "−23.−3".

Numbers that appear in log messages 30, whether integer or floating point, may be stored in compressed log messages 38 as values 42 with a common bit size, such as 64 bits. An integer may be directly encoded as a 64-bit signed integer. A floating-point number may be encoded as a 64-bit, double-precision floating point number. For example, the token "12.863" in the log example is a floating-point expression that may be converted to "0x4029b9db22d0e560" for storage. The limit on floating-point numbers as having fewer than 15 digits may be enforced to allow floating-point numbers to be stored as 64-bit representations.

The instructions 24 may discriminate between numbers and non-numeric expressions by applying the numeric schema 46 to each token 32 and considering any token 32 that conforms to the numeric schema 46 to be a number.

In addition, to aid with storing information in 64-bit chunks, the numeric schema 46 may define a range of reserved values, such as $2^{62}$ to $2^{63}-1$. The range of reserved values may be used to encode dictionary keys 40, as will be discussed below, and thus numbers within the range are not interpreted as numbers.

In various examples, an additional schema 48 may be applied to tokens 32 that are determined to not be numbers, so as to find non-numeric variable expressions. That is, tokens 32 may be tested against a non-numeric variable schema 48 to determine conformance after being tested against the numeric schema 46. The non-numeric variable schema 48 may require a token 32 to contain a numeric digit. As such, when applied to tokens 32 that fail to conform to the numeric schema, and are therefore not numbers, the non-numeric variable schema 48 identifies tokens 32 that are not numbers but contain a numeric digit. Examples of non-numeric variable expressions include "admin128" from the example log message above, as well as tokens such as "+23", "00232", "user123", "003.2", and "−23.−3".

As such, schemas 46, 48 may be cascaded, such that a token 32 is tested against a first schema 46 and then, if failing to conform to the first schema 46, is tested against a second schema 48. Any number and arrangement of schemas 46, 48 may be used. Accordingly, tokens 32 may be classified and dealt with accordingly. A token 32 that fails to confirm to all schemas 46, 48 may therefore be considered information that communicates the type of log message, provides context, or serves a purpose other than the expression of variables. Such information may be considered static text and is referred to as log-type information herein. In some cases, it may be that log-type information occasionally actually contains an expression of a variable. This may occur because the schemas 46, 48 are based on expected log content and not examination of program code. However, this is considered an acceptable trade-off. Further, schema 46, 48 definitions and their hierarchy may be defined and refined to reduce, minimize, or prevent the misclassification of a variable expression as log-type information.

The log-type dictionary 36 stores log-type information, that is, information that fails to conform to the schemas 46, 48. A log-type key 40 to the log-type dictionary 36 may be stored in a compressed log message 38.

Accordingly, a log message 30 may divided into relatively dynamic information, such as timestamps, numeric values, and keys 40 to the non-numeric expression dictionary 34; and relatively static information, such as keys 40 to the log-type dictionary 36. Efficient compressed log messages 38 may thus be generated.

Figure 3:
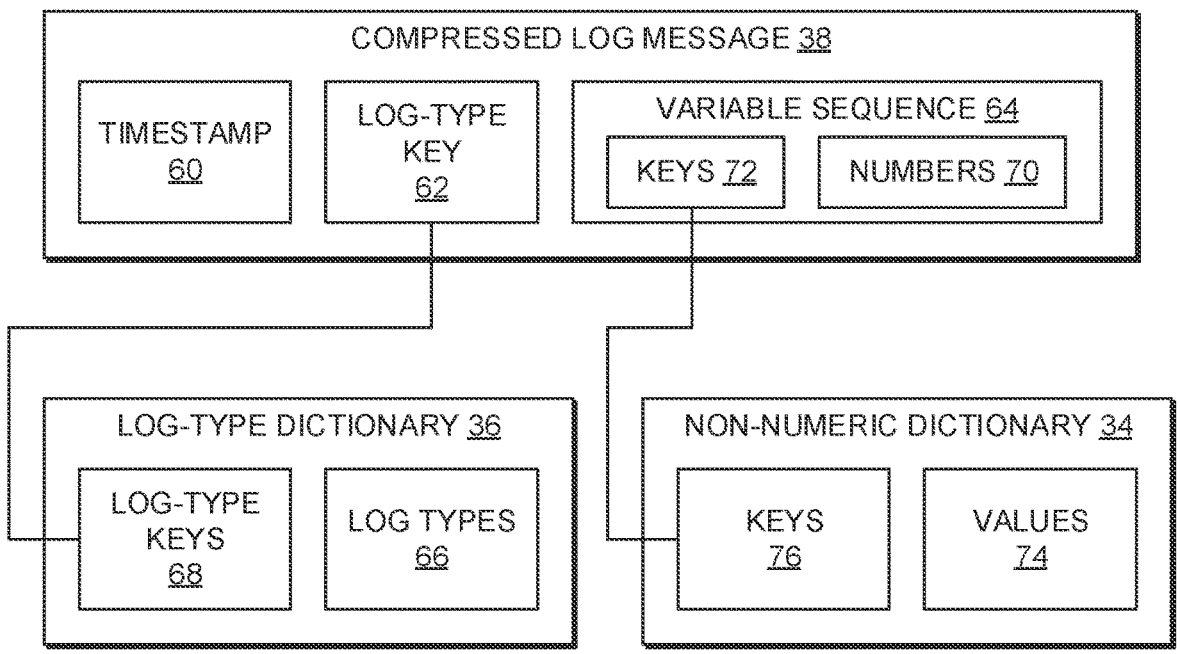
FIG. 3 is a block diagram of dictionaries used to compress and decompress log messages and the association of the dictionaries with compressed log messages.

FIG. 3 shows an example compressed log message 38. The compressed log message 38 may store a timestamp 60, a log-type key 62, and a variable sequence 64.

The timestamp 60 may have an integer format, as discussed above, such as a Unix epoch timestamp.

The log-type key 62 is a unique reference to a log-type dictionary 36 that stores log-type information 66 correlated to a set of log-type keys 68. When a log message is compressed, the log-type dictionary 36 is searched for the log-type information identified in the log message. If found, the associated log-type key 62 is added to the compressed log message 38. If not found, a new log-type key 62 is added to the dictionary 36 with the new log-type information and is further added to the compressed log message 38.

The variable sequence 64 contains numeric expressions 70 and keys 72 for non-numeric expressions. The variable sequence 64 may use an ordering scheme, such that the order of the individual numeric expressions 70 and keys 72 is the same order as they occur in the raw log message.

A non-numeric expression key 72 is a unique reference to a non-numeric expression dictionary 34 that stores non-numeric values 74 correlated to a set of non-numeric expression keys 76. When a log message is compressed, the non-numeric expression dictionary 34 is searched for a non-numeric expression identified in the log message. If found, the associated non-numeric expression key 72 is added to the compressed log message 38. If not found, a new non-numeric expression key 72 is added to the dictionary 34 with the newly identified non-numeric expression and is further added to the compressed log message 38.

As such, a compressed log message 38 stores keys 62, 72 to respective dictionaries 36, 34 and values, such as numbers 70 and a timestamp 60, that are not dictionary encoded.

The log-type information 66, non-numeric expression key 72, and other values, such as numbers 70 and a timestamp 60, may be provided with an arrangement schema so that the original log message may be recovered from the compressed log message 38 in a lossless manner.

Figure 4:
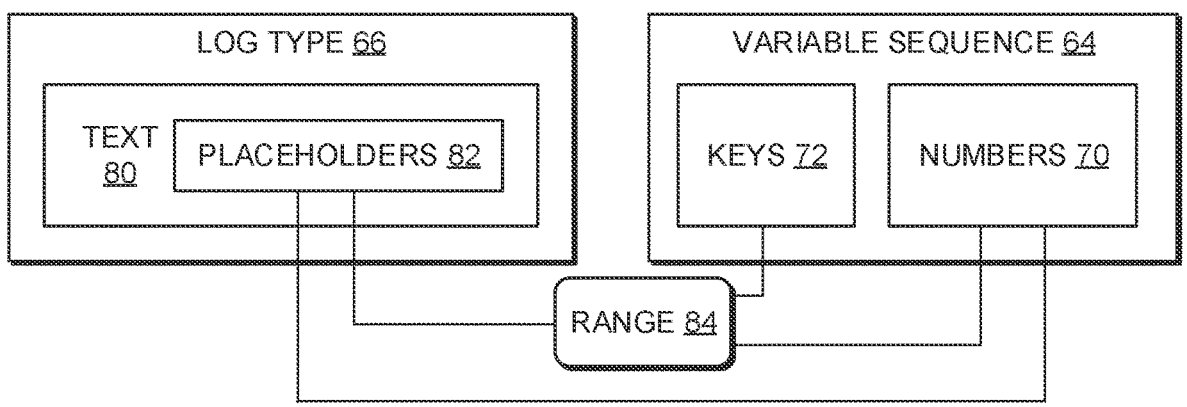
FIG. 4 is a block diagram of a relationship between a log type and an ordered sequence of values that may include numeric values and/or keys to a dictionary of non-numeric expressions.

With reference to FIG. 4, an example arrangement schema defines a log-type 66 as text 80 with placeholders 82. Text 80 may include tokens that were not identified to be numbers or non-numeric expressions as well as delimiters used to perform tokenization. That is, text 80 may be the information of the log message 30 that failed to conform to the schemas 46, 48 used to parse the tokens 32 of the log message 30 (FIG. 2).

Placeholders 82 are codes inserted into the text 80 at locations where non-numeric expressions and numeric values were identified. Placeholders 82 substitute for non-numeric expressions and numeric values in the log-type 66 and may designate how a substituted value is to be interpreted. The order of the individual keys 72 and numbers 70 in the variable sequence 64 of the compressed log message 38 is maintained in the same order as the placeholders 82 in the text 80 of the log-type 66 to facilitate simple substitution when reconstructing the original log message.

Example placeholders 82 include an integer placeholder and a floating-point placeholder. An example integer placeholder may substitute for both an integer numeric value and a non-numeric expression. This is possible when a range of reserved values 84 is used in the numeric schema 46. For example, an element of the variable sequence 64 that falls within the range (e.g., $2^{62}$ to $2^{63}-1$) may be interpreted as a key 72 while an element outside the range 84 may be interpreted as an integer. In a sense, the integer number space is overloaded to store integers and keys 72 for non-numeric expressions. An example integer placeholder is "0x11".

An example floating-point placeholder may provide information to properly render the floating-point number which may be stored as an integer number 70. An example floating-point placeholder is different from the integer placeholder and further encodes the translation information. For example, a byte with the value "0x12" may be combined with another byte, in which the first 4 bits are used to store the number of digits before the decimal point and the last 4 bits store the number of digits after the decimal point. This allows lossless reconstruction of the original floating-point value. For example, a floating point expression "12.863" may be represented by the placeholder "0x1223" in the text 80 of the a log type 66, where the second byte, "0x23", represents that the number has 2 digits and 3 digits before and after the decimal point, respectively.

Placeholders 82 may be escaped, for example, when a raw log message includes a placeholder character. A placeholder character present in a raw log message may be escaped using a predetermined escape character, e.g., a backslash "\". Specifically, when generating a log type from a raw log message, any existing placeholder and escape characters from the raw log message may be modified to be preceded by the escape character. Then, when decompressing a compressed log message, unescaped placeholders will be substituted with variable values, and escaped placeholders will be unescaped, so as to reverse the escaping process.

In addition, use of the dictionaries 34, 36 allows for the possibility of useful obfuscation of data. For example, obfuscating a username, e.g., "johnsmart9", from all log messages may be achieved by changing the value 74 of the username in the non-numeric expression dictionary 34. The value 74 may be changed by hashing it, using a table lookup (value 74 as input and obfuscated name as output), or even by directly replacing the value 74 with an obfuscated value in the dictionary 34. Similarly, if a user wishes to hide all usernames from a certain log type, they may simply modify the log type 66 in the dictionary 36 to contain a special placeholder in place of a username placeholder 82. The special placeholder may indicate that the system should skip the corresponding variable during decompression and instead replace it with a generic string.

Figure 5:
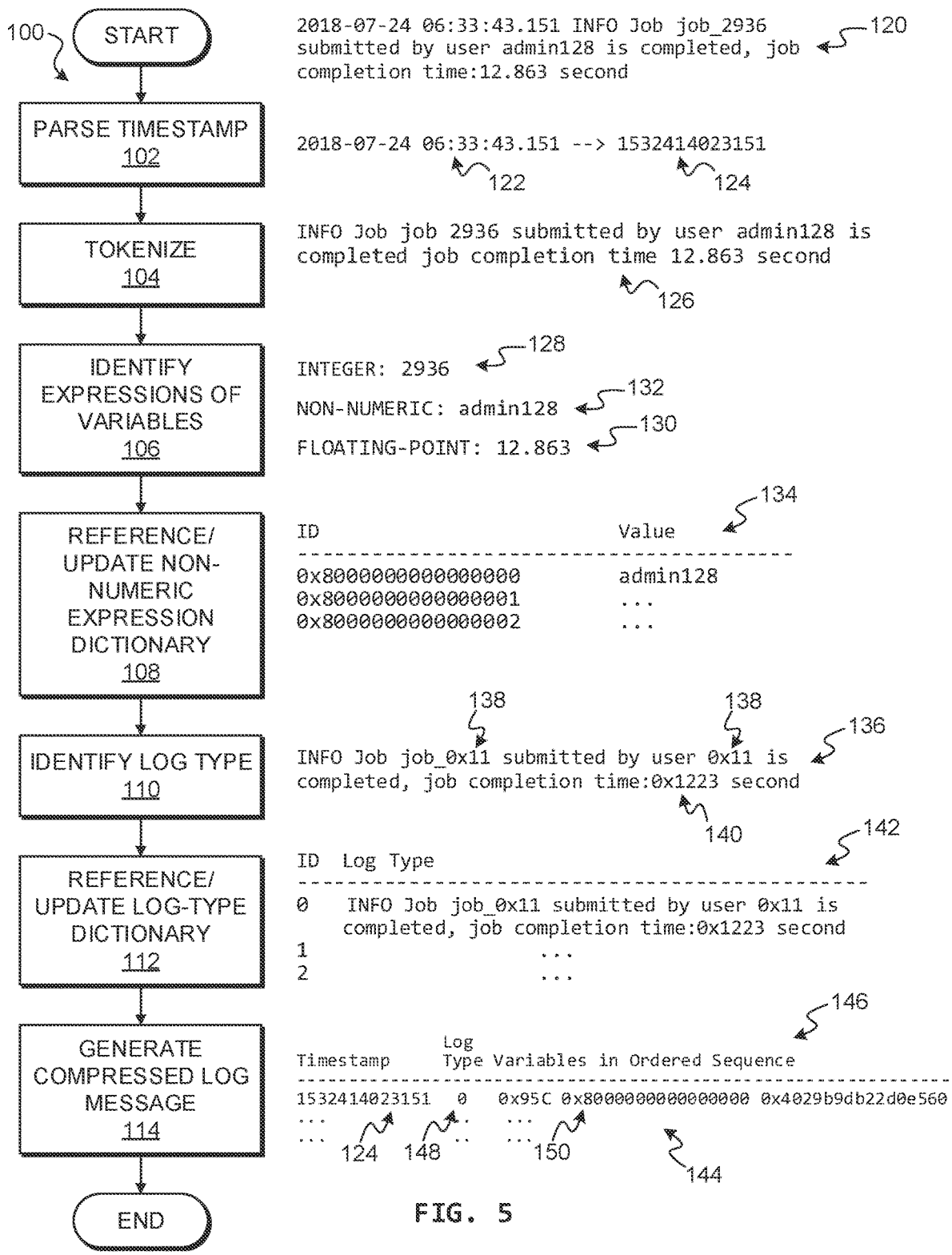
FIG. 5 is a flowchart of a method of compressing a log message with a practical example.

FIG. 5 shows an example method 100 of compressing a log message 120 in conjunction with example values. The method 100 may be implemented by instructions usable with a memory and processor.

At block 102, a timestamp 122, if any, is parsed in the log message 120. A plurality of timestamps schemas may be applied to the log message 120 to detect a timestamp. An identified timestamp 122 may be converted into an integer representation 124, such as a Unix epoch timestamp.

At block 104, the remainder of the log message 120 is tokenized using a set of delimiters. An ordered sequence of tokens 126 is obtained.

At block 106, the tokens 126 are analyzed to identify expressions of variables. In various examples, variable expressions are considered to be numbers and text that contains numbers. A numeric schema may be applied to each token to determine whether or not the token is a numeric expression, i.e., a number. A token 126 may be identified as a numeric expression, such as an integer expression 128 and a floating-point expression 130. A non-numeric expression 132 may be a series of letters or other characters that contains at least one numeric digit. A non-numeric schema may be applied. The numeric and non-numeric schemas may be applied in order, so that tokens are identified as numbers first and then any tokens 126 not identified as numbers are tested to determine whether they are non-numeric expressions.

Tokens 126 that are identified as a numeric or as non-numeric expressions may be converted to a common format, such as a 64-bit value. Such a value communicates the actual value of a numeric expression or, in the case of a non-numeric expression, is a dictionary key to look up the non-numeric expression in a dictionary.

At block 108, a non-numeric expression dictionary 134 is referenced for any non-numeric expressions 132 identified among the tokens 126. A key or ID in the dictionary 134 is obtained for a matching non-numeric expression. If a non-numeric expression is not present in the dictionary 134, it is added to the dictionary 134 under a new key or ID.

At block 110, a log type 136 is identified. Log type may be taken as the tokens remaining after identification of numeric and non-numeric variable expressions as well as the delimiters. In other words, log type 136 may be the original log message without the timestamp and with numeric and non-numeric variable expressions replaced by placeholders. Placeholders may include an integer placeholder 138 that serves double duty as a non-numeric expression placeholder and a floating-point placeholder 140 that describes how to parse a representation of the floating-point number.

At block 112, a log-type dictionary 142 is referenced for the identified log type 136. A key or ID in the dictionary 142 is obtained for a matching log type 136. If the log type 136 is not present in the dictionary 142, it is added to the dictionary 142 under a new key or ID.

At block 114, a compressed log message 144 is generated. The compressed log message 144 may be stored in a database table 146 or similar data structure. The compressed log message 144 includes the representation 124 of the timestamp, a log-type key or ID 148 that identifies the log type in the log-type dictionary 142, and an ordered sequence 150 of identified numeric and non-numeric expressions identified from the tokens 126. The timestamp representation 124 may be stored in a timestamp field of a database table, the log-type key 148 may be stored in a log-type field, and any non-numeric keys and numeric values may be stored in a variables field as an ordered sequence 150 of values. All information of the original log message 120 is stored in a lossless manner. The ordered sequence 150 contains common-format representation of identified numeric and non-numeric expressions in the same order as present in the log type 126 and original message 120. As such, a simple ordered substitution of placeholders 138, 140 in the log type 126 with the ordered sequence 150 of values can be used to reconstruct the original log message 120.

Figure 6:
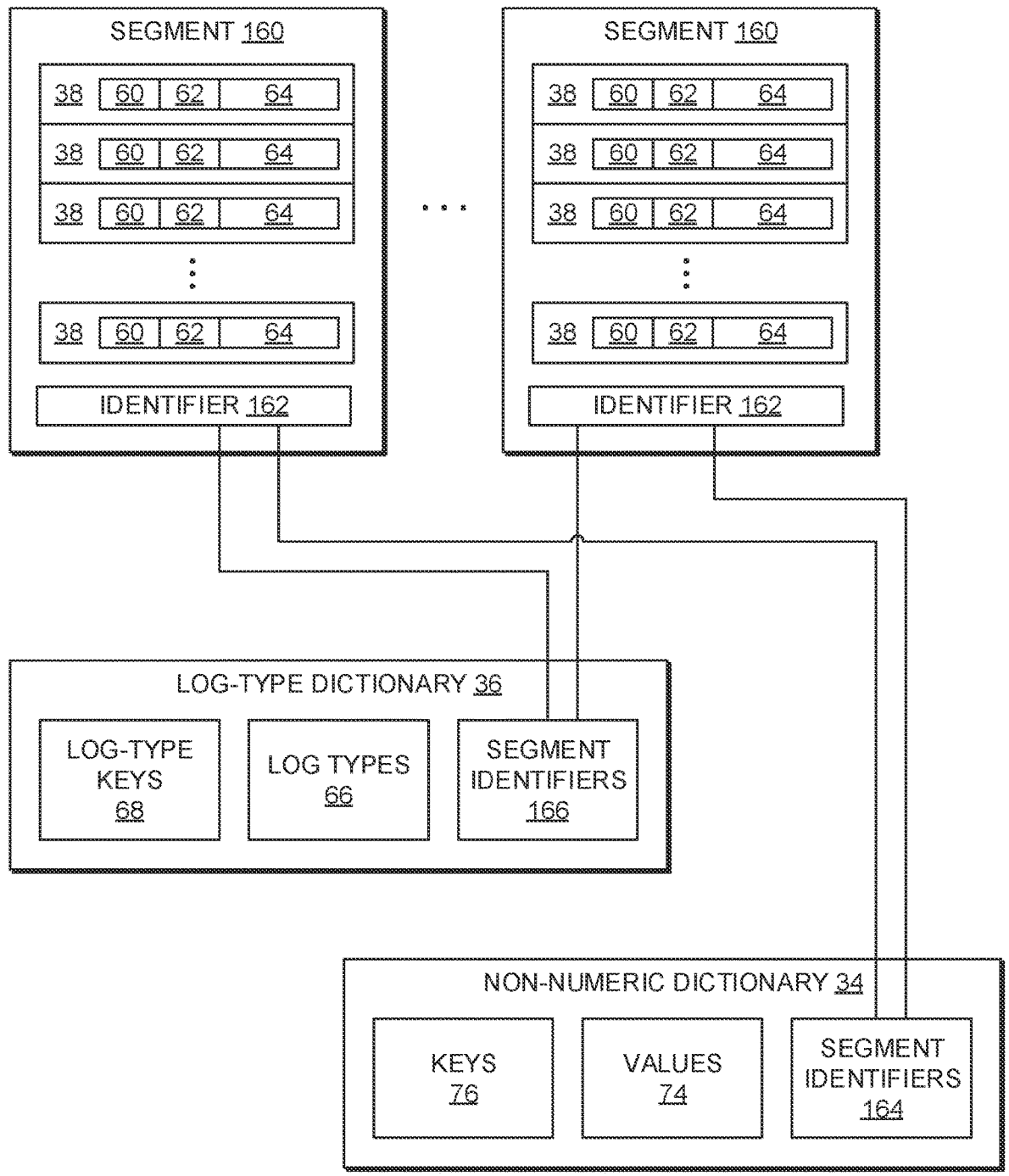
FIG. 6 is a block diagram of a relationship between segments of log messages and dictionaries.

With reference to FIG. 6, compressed log messages 38 may be stored in segments 160.

A log file may include one or more log messages 38. In various examples, log messages 38 of a plurality of log files are compressed into a segment 160. In this manner, a plurality of segments 160 may be generated, where each segment 160 includes a plurality of compressed log messages 38. Each segment 160 may have a unique identifier 162.

Each element of a dictionary 34, 36 may be stored with an indication(s) of the segment(s) 160 in which the element is referenced. That is, each non-numeric expression 74 in the non-numeric expression dictionary 34 may be associated with one or more identifiers 164 of one or more segments 160 that contain a compressed log message 38 that contains the key 76 for the non-numeric expression 74. Similarly, each log-type 66 in the log-type dictionary 36 may be associated with one or more identifiers 166 of one or more segments 160 that contain a compressed log message 38 that contains the key 68 for the log-type 66. Accordingly, a segment or segments 160 of compressed log messages 38 that reference a particular non-numeric expression 74 and/or log-type 66 may be quickly identified. This may speed up searching, in that a query may be tested against a dictionary 34, 36 to exclude segments 160 that do not contain information relevant to the query. That is, segments 160 not associated with a non-numeric expression 74 and/or log-type 66 that matches the query need not be considered further.

The log-type dictionary 36 may be the same single log-type dictionary for a plurality of segments 160. Likewise, the non-numeric expression dictionary 34 may be the same single non-numeric expression dictionary for the plurality of segments 160. Compression effectiveness can be increased by using a single dictionary for a large number of log messages.

Figure 7:
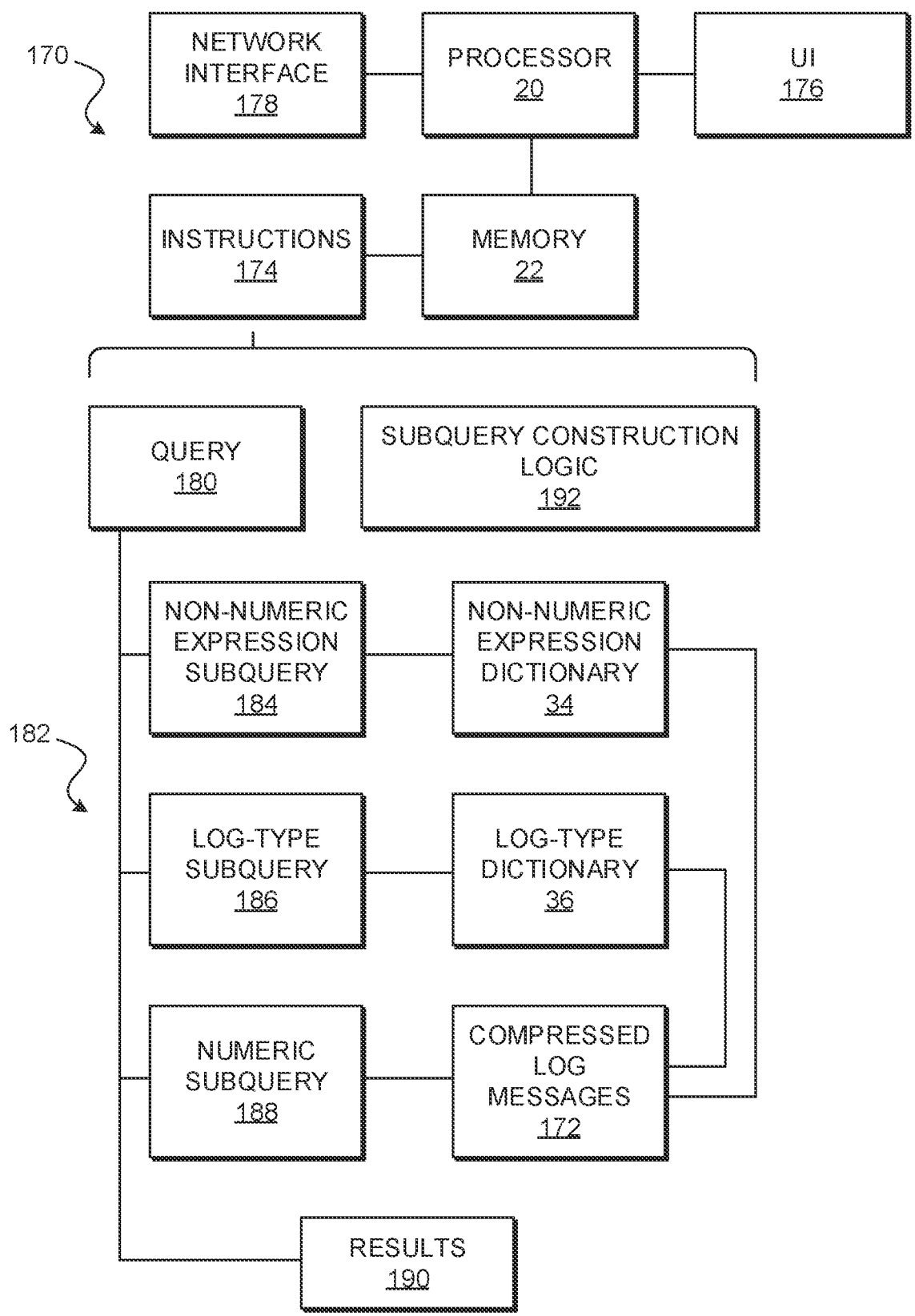
FIG. 7 is a block diagram of a system for searching log messages.

FIG. 7 shows an example system 170 configured to search compressed log messages 172. The system 170 may be the same as the system 10 or may contain similar or identical components. The description of the system 10 may be referenced for detail not repeated here.

The system 170 includes instructions 174 that perform searching on compressed log messages 172. Compressed log messages 172 may be similar or identical to compressed log messages 14, 38, among other, discussed herein.

The instructions 174 receive a query 180 to search the compressed log messages 172. The query 180 may be provided through a user interface 176 or a network interface 178 provided to the system 170. A network interface 178 may be connected to the processor 20 and may receive queries 180 from remote devices in implementations where the system 170 is a server. A user interface 176 may include a keyboard, display device, touchscreen, or similar device that may receive directly entered queries 180 in implementations where the system 170 is a user computer.

The instructions 174 generate one or more subqueries 182 based on the query 180. Different subqueries 182 are contemplated for different targets, such as a non-numeric expression dictionary 34 referenced by the compressed log messages 172, a log-type dictionary 36 referenced by the compressed log messages 172, and the content of the compressed log messages 172. The instructions 174 execute the subqueries 182 and output a collection of results 190.

A non-numeric expression subquery 184 is executable on the non-numeric expression dictionary 34 to match non-numeric expressions of variables contained therein.

A log-type subquery 186 is executable on the log-type dictionary 36 to match log information contained therein, such as log message information that excludes expressions of variables and numeric values.

A numeric subquery 188 is executable on the compressed log messages 172 to match numeric representations stored therein.

Rules that analyze a query 180 and generate appropriate subqueries 182 may be stored in subquery construction logic 192, which may be transparent to the user or configurable. Subquery construction logic 192 parses a received query 180 and generates a corresponding composition of subqueries 182 to execute on the collection of compressed log data in the form of the non-numeric expression dictionary 34, a log-type dictionary 36, and the compressed log messages 172. The generation of the corresponding composition of subqueries 182 is based on the logic used to separate the contents of the dictionaries 34, 36 and log messages 172. Examples of such logic are given elsewhere herein, such as the schemas 46, 48.

Any number and combination of subqueries 182 may be generated from a query 180. A query 180 may include a search phrase, and multiple different subqueries may be generated from the search phrase according to a desired search structure.

The instructions 174 may return all reconstructed log messages that match a search phrase, i.e., log messages that contain the search phrase as a substring.

For a given search phrase, the instructions 174 identify where matching elements may be stored. A numeric schema 46 and a non-numeric schema 48 may be used. For instance, a search phrase that conforms to the numeric schema 46 may be matched with elements in the compressed log messages 172 as that is where numeric values are stored. A search phrase that does not match the numeric schema 46 but does match the non-numeric schema 48 may be matched with elements in the non-numeric expression dictionary 34 as that is where such elements are stored. A search phrase that does not match the numeric schema 46 and the non-numeric schema 48 may be matched with elements in the log-type dictionary 36.

Wildcards may also be used. For example, an asterisk "*" may be used to match zero or more characters and a question mark "?" may be used to match one character. Accordingly, the instructions 174 may generate multiple different subqueries 182 from a search phrase that contains a wildcard. For example, given the following example queries:

Query 1: "user"
Query 2: "INFO * by user"
Query 3: "job*"
Query 4: "completion time:12.*"
Query 5: "12*"

Query 1's search phrase, "user", can only be stored in log-type dictionary 36 and therefore the instructions 174 may limit the search to the log-type dictionary 36 to match a log-type that contains "user" as a substring. The search phrase in Query 3, "job*", can be part of a log type or non-numeric expression, so the instructions 174 may generate two subqueries, one for the log-type dictionary 36 and another for the for non-numeric expression dictionary 34 to find log types and/or expressions of variables that have "job" as a substring. The two subqueries may be joined by OR logic, in that satisfying one or both of the two subqueries will satisfy Query 3.

Regarding numeric subqueries 188, the instructions 174 may first search the log-type dictionary 36 to determine which log types contain at least one numeric value. That is, log information that contains a numeric placeholder may be identified and the log-type keys may be obtained. Then, a subset of compressed log messages 172 that contain the identified log-type keys may be obtained. The numeric value in the numeric subquery 188 is then compared to the content of the subset of compressed log messages 172 to find substring matches. This avoids searching compressed log messages 172 that contain no numbers and therefore have no chance of matching the numeric subquery 188. This may increase the speed of searches and/or reduce the resources needed.

Further regarding numeric subqueries 188, the conversion logic applied to store integers and floating-point numbers in the compressed log messages 172 may be referenced when generating numeric subqueries 188. For example, a search phrase that identifies a floating-point number should be converted to the corresponding representation (e.g., 64-bit value) of the floating-point number as stored in the compressed log messages 172.

The instructions 174 may further consider segments 160 (FIG. 6) when executing subqueries 182. A non-numeric expression subquery 184 may be matched to a non-numeric expression in the non-numeric expression dictionary 34. If the matched non-numeric expression in the dictionary 34 is associated with specific segments 160 (FIG. 6), then other segments 160 may be removed from consideration for further processing of additional subqueries, such as a numeric subquery 188 joined by conjunctive logic (AND) to the non-numeric expression subquery 184. That is, there is no need to search all segments 160 for a number when only a subset of segments 160 contains the requisite non-numeric expression. Similarly, a log-type subquery 186 may be matched to log types in the log-type dictionary 36 and thereby identify a relevant subset of segments 160 for consideration with other subqueries.

This may be implemented by obtaining results from subqueries in the form of segment identifiers and then applying the composition logic to obtain sets of segment identifiers. A numeric subquery 188 is assigned the set of segments 160 that contain at least one numeric value, which may be determined by searching a log-type dictionary 36 to determine which log types contain at least one numeric value. Log-type and non-numeric subqueries 186, 184 return respective sets of segments 160 from the respective dictionaries 36, 34. The composition logic is then applied to the sets of segments 160 and the resulting set of segments 160 contains the compressed log messages that the subqueries should be executed against. Other segments may be ignored.

For example, assuming 10 segments exist, a log-type subquery 186 identifies segment IDs 3 and 4 as relevant and a non-numeric subquery 184 identifies segment IDs 4 and 5 as relevant. If the subqueries 186, 184 are joined by AND logic, only the segment with ID 4 need be considered. If the subqueries 186, 184 are joined by OR logic, only the segments with IDs 3-5 need be considered.

FIG. 8 shows further information concerning the example Queries 1 to 5 mentioned above. As shown various search phrases may generate one or more subqueries, which may be composed using AND, OR, or other composition logic, for execution against the relevant sources of information. This precisely simulates applying the original query directly to the original log messages. However, since the sources of information (e.g., dictionaries 34, 36 and compressed messages 172) represent a compressed form of the original log messages, searching is performed more efficiently.

For the first two searches shown in FIG. 8, there is only one log type subquery. The log-type dictionary 36 is searched to obtain a set of matching log types and the segments that contain these log types. Each compressed log message in these segments is then checked to determine if its log type is in the set. If so, the compressed log message is decompressed and returned as a result.

For the third search "job*", two subqueries are performed in parallel. The first subquery returns a set $S_{logtype}$ that contains the keys of the matching log types, and a set of segment identifiers $S'_{logtype}$. The second subquery returns a set $S_{var}$ that contains the keys of the matching non-numeric expressions and a set of segment identifiers $S'_{var}$. A set union is then performed on the two segment identifier sets: $S'_{logtype} \cup S'_{var}$, and only the segments in this set union are examined. For each compressed log message in a segment, if its log-type key is in $S_{logtype}$ or one of its expression keys is in $S_{var}$, it is decompressed and returned as a search result.

For the search "completion time:12.*", the composition "SQ1 and (SQ2 or SQ3)" is processed by converting it to the equivalent expression "(SQ1 and SQ2) or (SQ1 and SQ3)". The processing of (SQ1 and SQ2) is similar to the processing of the above search example, that a log-type subquery and a non-numeric expression subquery are performed. One difference is that a matching compressed log message needs to satisfy both subqueries. The composition "(SQ1 and SQ3)" is processed by searching the log-type dictionary 36 for log types that match both SQ1 and contain a floating-point placeholder. Each compressed log message in the matching segments is processed and a decompressed version of a matching log message is returned.

For the search "12*", three subqueries are performed in parallel, and any compressed log messages that match at least one of the subqueries are returned as results.

Figure 9:
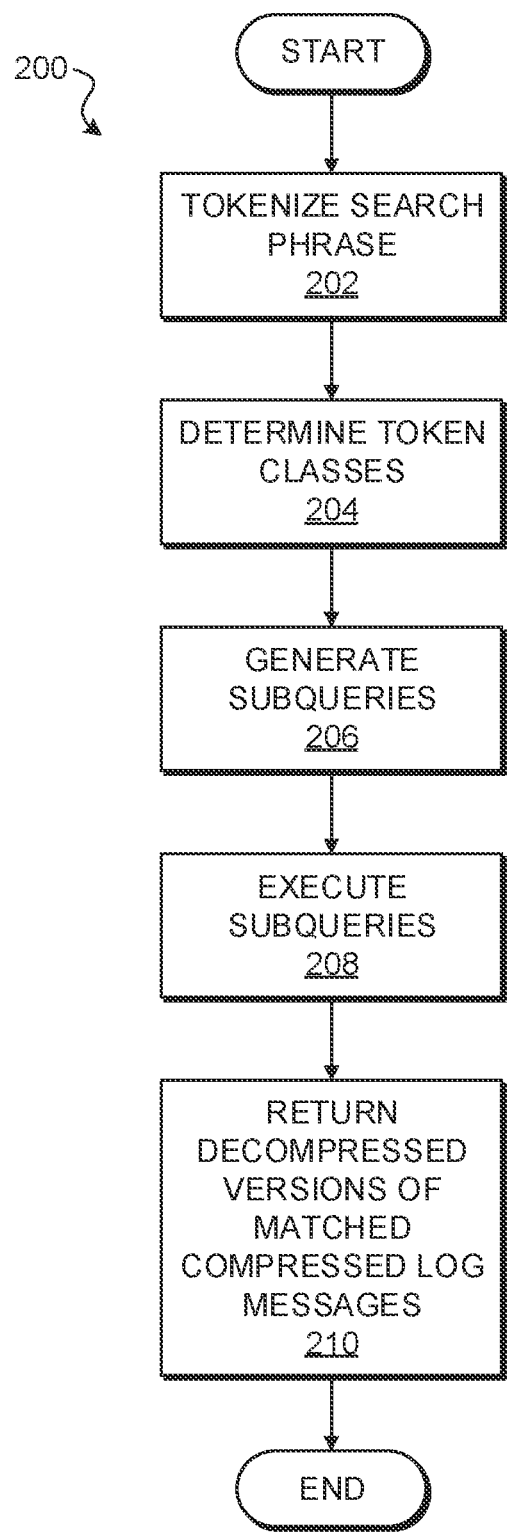
FIG. 9 is a flowchart of a method of searching compressed log messages.

FIG. 9 shows a method 200 for searching compressed log messages. The method 200 may be implemented by instructions usable with a memory and processor.

At block 202, a search phrase is split into tokens. The delimiters discussed above for tokenizing log messages may also be used to tokenize a search phrase. If wildcards are implemented, a delimiter and wildcard may use the same character. In such case, the character when unescaped may be considered a wildcard. If a token is adjacent a wildcard, such as "*", the "*" may be taken as part of the token. For example, "job*" is a treated as a token. If consecutive tokens are connected by "*" various combinations of tokens may be considered. For example, a search string "var1*var2" may be interpreted as one token "var1*var2" or two tokens "var1*" and "*var2". All cases may be considered with a subquery generated for each, i.e., a subquery for each of "var1*var2", "var1*", and "*var2". Block 202 results in a set of search tokens that consider wildcards, if used.

At block 204, a class of each token is determined. Token classes include log-type, integer, floating point, and non-numeric expression. A token can have multiple possible classes. For example, "job*" can be a log-type or a non-numeric expression, but it cannot be an integer or floating-point number. As another example, "12*" can be an integer, floating-point number, or non-numeric expression, but not a log type. The schemas 46, 48 used to compress the log messages may be applied to assign classes to tokens.

At block 206, subqueries are generated from the tokens and their classes and the subqueries are composed. For each token that that has one class that is not log-type, then a subquery based on its class may be directly generated. If a token has multiple classes, then multiple subqueries are generated, one for each class. Such subqueries are composed with alternative (OR) logic. For example, three subqueries may be generated for token "12*" and joined with OR logic, as shown in FIG. 8. For all tokens that are of the log-type class, these tokens are combined into a single log-type subquery. For example, for the search string "INFO * by user", all three tokens "INFO", "by", and "user" are combined into a single subquery "INFO * by user" that is executed on the log-type dictionary 36.

Subqueries generated from different tokens in a search phrase are composed with AND, indicating that the matching log message should match all these subqueries. For example, the search phrase "completion time:12.*" generates three subqueries, as shown in FIG. 8. SQ1 has an AND relationship with (SQ2 OR SQ3), indicating a matching log message should match SQ1 and either SQ2 or SQ3.

At block 208, each subquery is executed against the appropriate data source, as discussed elsewhere herein. When there are multiple subqueries that are composed with an AND relationship, various optimizations may be performed. First, if no result is found for any one of the subqueries, the entire search is immediately canceled and no results are returned. Second, integer and floating-point subqueries may first be processed against the log-type dictionary to reduce the quantity of compressed log messages to check. Hence, if two subqueries have an AND relationship and one of them is a log-type subquery and the other is an integer or floating-point numeric subquery, the two subqueries can be combined into a single subquery against log-type dictionary. Such a combined subquery searches for log types that satisfy the log-type subquery and have an integer or floating-point expression. Then, only the compressed log messages that have one of these log types for the integer or floating-point expression are searched. Subqueries that have an OR relationship are processed in parallel.

At block 210, matched log messages are returned as results. Once all of the compressed log messages that match the composition of all the subqueries are identified, these compressed log messages are decompressed in a lossless manner. Thus, original log messages are returned. Note that when the log-type dictionary and non-numeric expression dictionary store a list of segments that contain each log type and non-numeric expression, such segment lists may be used to avoid processing segments that do not contain matching log types or values.

Figure 10:
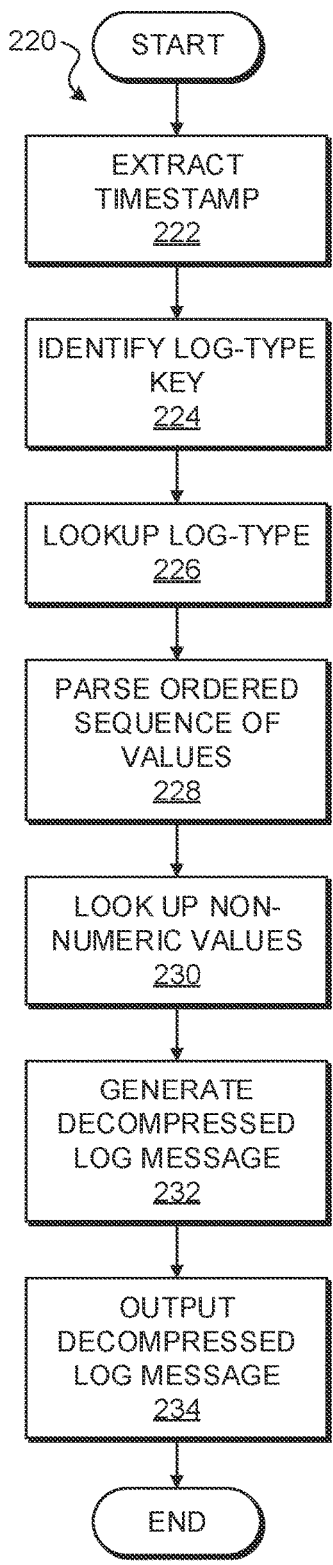
FIG. 10 is a flowchart of a method of decompressing a compressed log message with a practical example.
Figure 10:
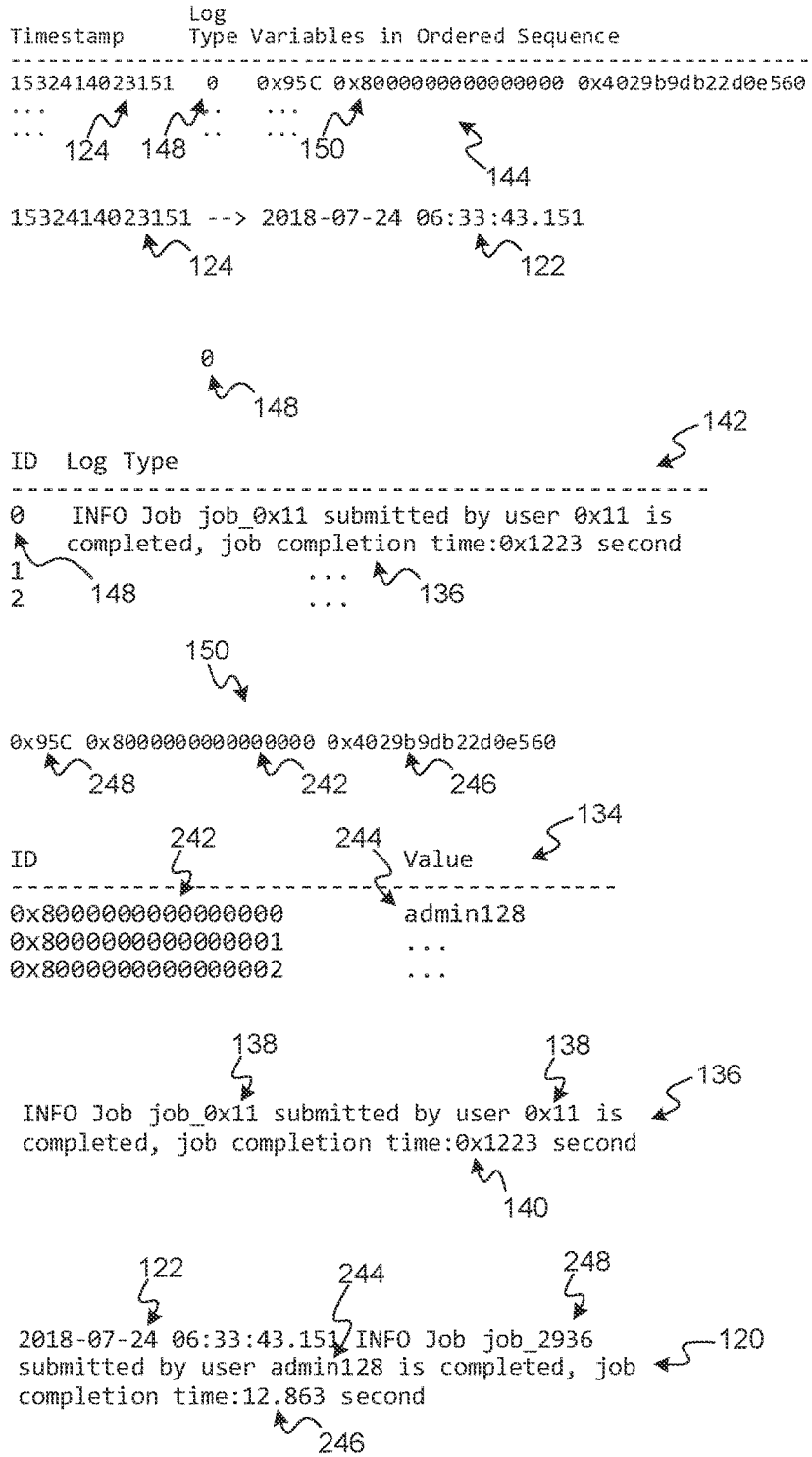

FIG. 10 shows a method 220 for decompressing compressed log messages. The method 220 may be implemented by instructions usable with a memory and processor. The method 220 may be used to implement block 210 in the searching method 200 of FIG. 9.

At block 222, a representation of a timestamp may be identified in a compressed log message. A timestamp representation 124 may be identified by its field or position within the compressed log message 144. The timestamp representation 124 may then be converted to a human-readable format 122.

At block 224, a log-type key is identified in the compressed log message. A log-type key 148 may be identified by its field or position within the compressed log message 144.

At block 226, the log-type key is looked up in a log-type dictionary to obtain an expression of log information or log type 136. The log-type key 148 is applied to a log-type dictionary 142 to obtain the log type text 136.

At block 228, an ordered sequence 150 of values is identified in the compressed log message 144 and is parsed to discriminate between numeric values and dictionary keys for non-numeric information. Each value in the ordered sequence 150 is tested to determine whether the value represents a numeric expression or a non-numeric expression. A numeric value may be a value determined to be outside a range of reserved values, such as $2^{62}$ to $2^{63}-1$ in examples where values are stored as 64-bit values. A value that lies within the range of reserved values may be considered a dictionary key.

At block 230, any identified keys 242 are looked up in a non-numeric expression dictionary 134 to obtain a corresponding non-numeric expression 244 of a variable.

At block 232, the decompressed log message 120 is generated. This may include traversing placeholders 138, 140 in log-type text 136 and substituting a corresponding element from the ordered sequence 150 of values. A looked-up non-numeric expression 244 may be directly inserted as text. An identified numeric value 246 may be converted or formatted as needed. For example, decimal point information in floating-point placeholder 140 can be applied and then a string version of the floating-point number can be inserted into the log-type text 136 at the location of the placeholder 140. An identified integer numeric value 248 may be converted to a string and substituted for the corresponding placeholder 138.

At block 234, the decompressed log message 120 is outputted. The decompressed log message 120 may appear identical to the original log message.

Figure 11:
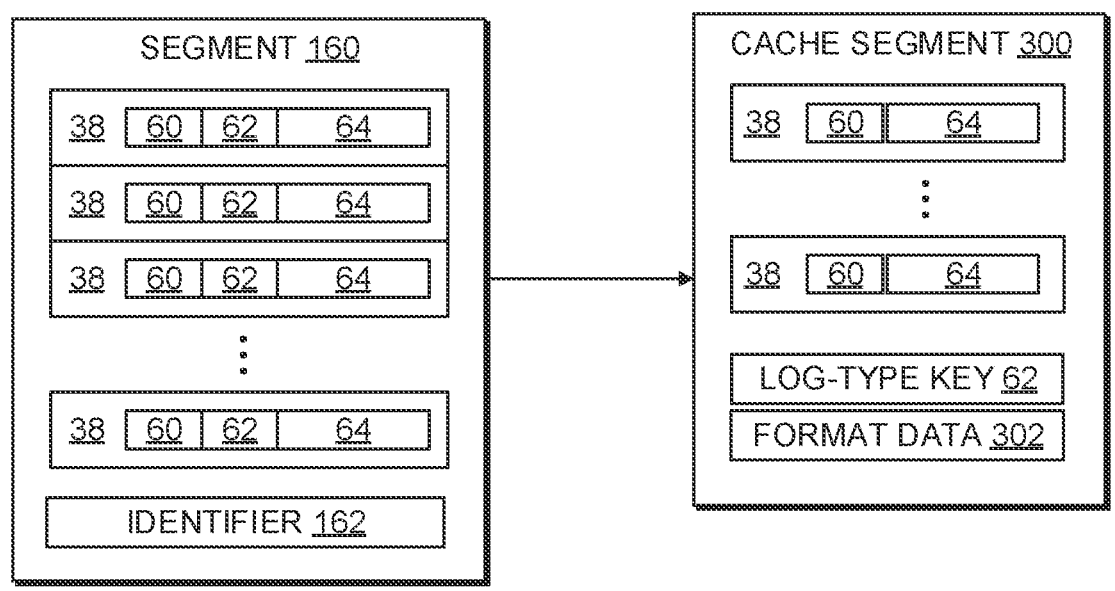
FIG. 11 is a block diagram of a cache segment.

With reference to FIG. 11, information contained in segments 160 (FIG. 6) may be cached to provide faster and more efficient searching. A cache segment 300 may be provided to store one log type, as may be indicated by a log-type key 62, that is infrequently used. Any number of cache segments 300 may be provided within the file/storage limits of the host system.

A cache segment 300 does not replace the underlying segment 160 from which the log type is obtained. Rather, cache segments 300 are searched first, so as to quickly obtain results for infrequent log types. When a query is executed, cache segments 300 are searched first to reduce inefficiencies and search time compared to immediately searching the segments 160 for infrequently used log types 62. For example, an infrequently used log type may occur in 10% of log messages 38. Searching the segments 160 immediately requires considering the other 90% of log types as well. When the infrequently used log type is stored in a cache segment 300 and the cache segments 300 are searched before the regular segments 160, the time that would be spent considering the other 90% of log types in the segments 160 may be saved. In short, caching infrequent log types for initial consideration during query execution may provide an overall time and efficiency gain.

A log type may be defined as infrequently used if it is used in a low number of log messages 38. A threshold number of log messages 38 may be established to determine whether a log type should be provided in a cache segment 300. When deciding which cache segment 300 to maintain and which to evict, the one associated with fewer log messages 38 may be kept. The number of messages that is considered low may be configured based on specific implementations and may be user selectable.

A recency limitation may be placed on cache segments 300. If a new cache segment 300 is to be generated and an existing cache segment 300 is to be evicted, then the existing cache segment 300 may be selected as one that has not recently fully or partially satisfied a query. The duration that is considered recent may be configured based on specific implementations and may be user selectable.

Infrequency and recency conditions may be combined. For example, when a new cache segment 300 is to be created for a new log type, a cache segment 300 to be evicted may be selected as one i) having a log type that has not been recently queried, and ii) having a log type that is associated with more messages than the new log type to be cached. The first condition may be used to ensure that the cache does not eventually become filled with the most infrequent log types due to the second condition.

A format of the cache segments 300 may be similar to the format of the regular segments 160. Various differences in format may include a log-type key 62 being associated with an entire cache segment 300 as opposed to individual log messages 38 as in the regular segments 160. This is because, by definition, a cache segment 300 concerns a single log type. In addition, a cache segment 300 format may include format data 302, such as message number, path identifier, and/or timestamp format identifier, which may be useful if the messages in a cache segment 300 are from various different log files.

As new log messages are captured, segments 160 are updated as discussed above. Cache segments 300 may also be updated to keep the cache of infrequent and recent log types current.

Figure 12:
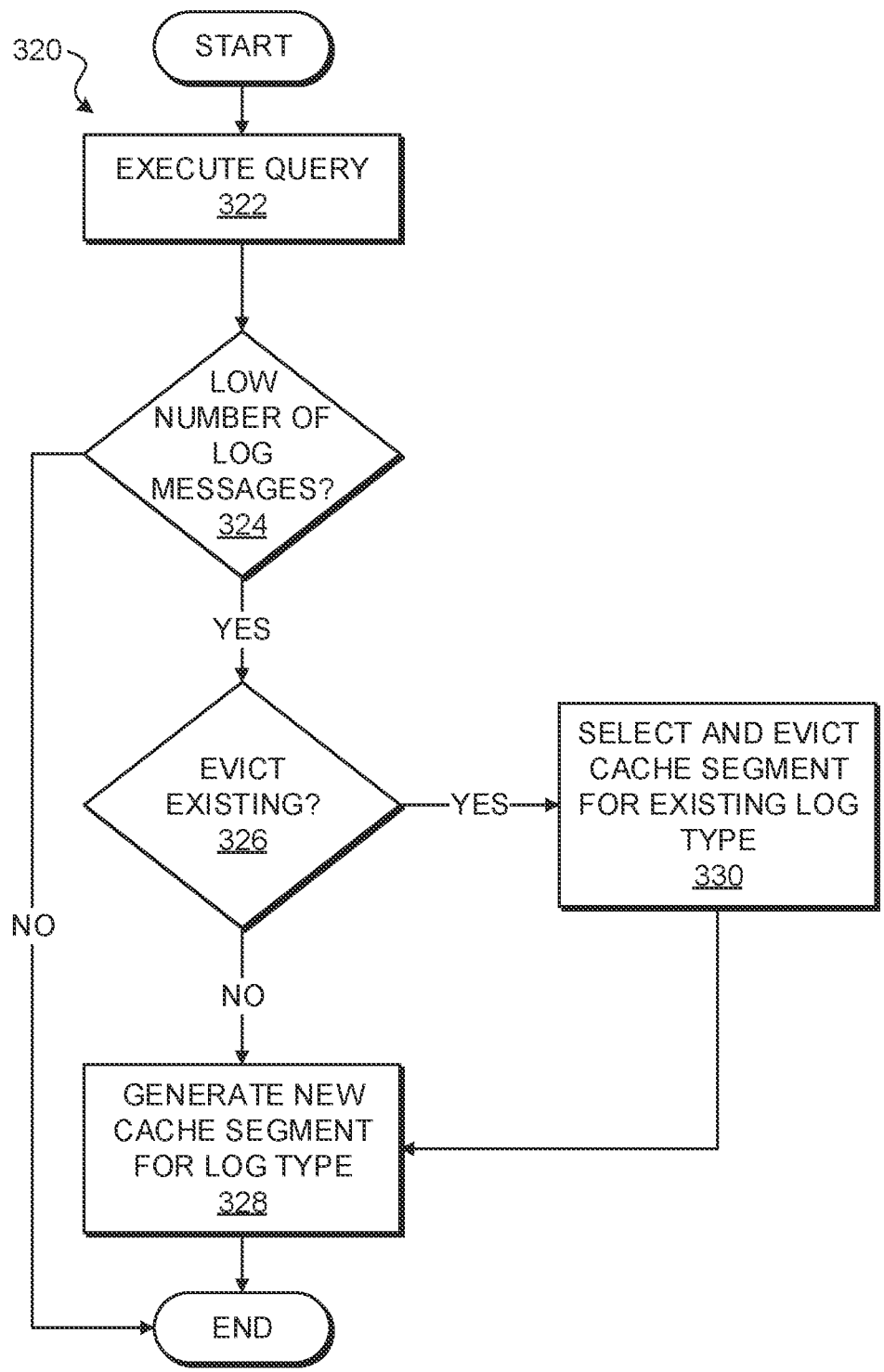
FIG. 12 is a flowchart of a method of creating a cache segment based on a query.

FIG. 12 shows an example method 320 of generating a new cache segment 300. The method 320 may be implemented by instructions usable with a memory and processor.

At block 322, a query is executed on segments 160 that store compressed log messages, as discussed elsewhere herein. Block 322 assumes that no cache segments 300 exist or those cache segments 300 that do exist do not fully or partially satisfy the query. To test a query against existing cache segments 300, see the method 340 of FIG. 13. The query returns a number of log messages of a log type or multiple log types. If multiple log types are returned, then blocks 324-330 may be performed for each of those log types.

At block 324, the number of returned log messages for a given log type is compared to a threshold number, so as to determine whether the log type is suitably infrequent to be cached. An example suitable infrequency is one that provides a net efficiency/speed gain for queries of the log type if cached, as opposed to merely querying the segments 160. If the log type is too frequent to benefit from caching, then the method 320 ends.

If the number of messages is conducive to caching the log type, then at block 326 it is determined whether an existing cached log type is to be evicted to accommodate the new log type. If an existing cache segment need not be discarded, then the new cache segment 300 is generated, at block 328.

If an existing cache segment needs to be discarded, then at block 330 an existing cache segment is selected. A recency and/or infrequency condition may be used. That is, the evicted cache segment may be one that has not been used to satisfy a recent query and that represents more log messages that the new cache segment to be created. That is, a relatively stale and frequent log type may be removed from the cache to make room for a more recently queried log type that represents a lower frequency of log messages. The new cache segment 300 is generated, at block 328, and the method ends.

Figure 13:
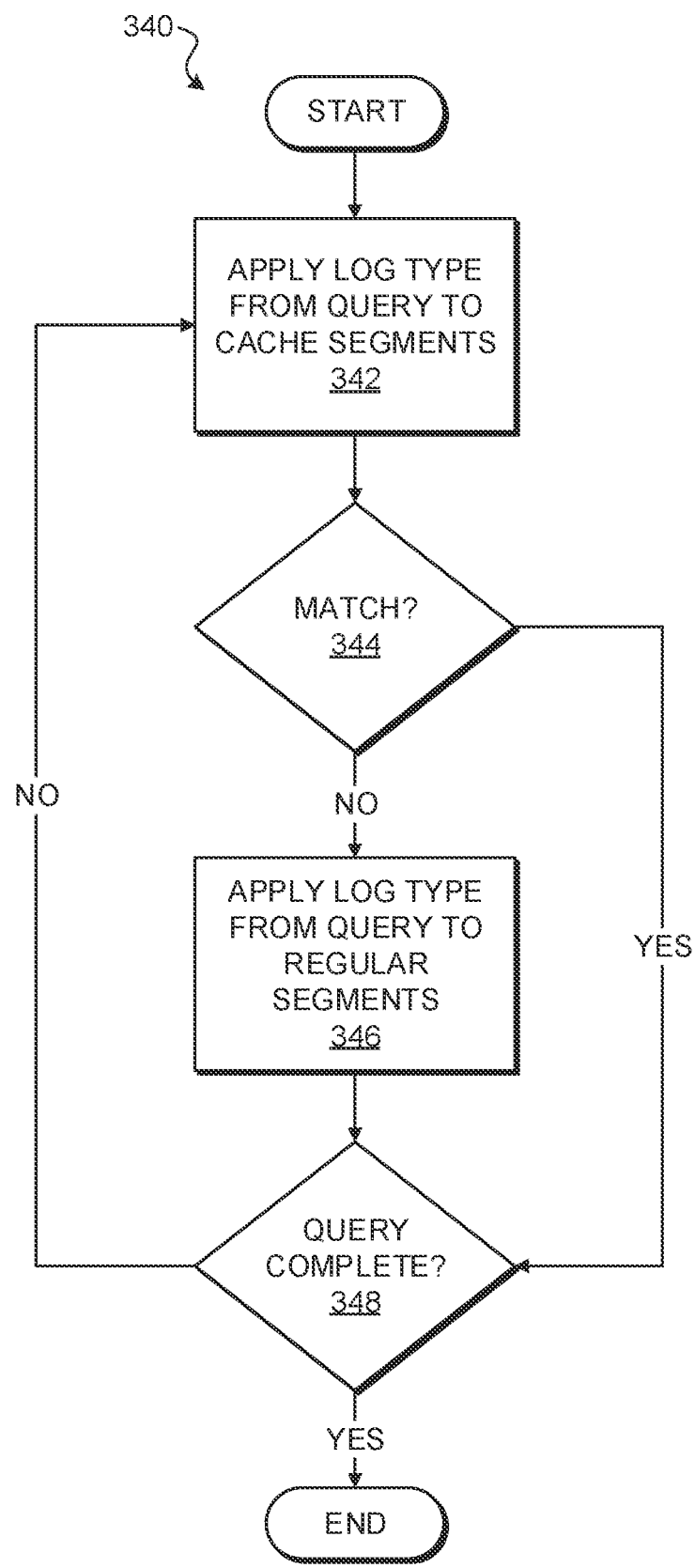
FIG. 13 is a flowchart of a method of querying segments including a cache segment.

FIG. 13 shows an example method 340 of querying segments 160 including any number of cache segments 300. The method 340 may be implemented by instructions usable with a memory and processor. The method 340 may be used to implement block 322 of the method 320.

At block 342, a query is first applied to cache segments 300. The query may include subqueries, as discussed elsewhere herein. A log type in the query, as represented by a log-type key 62, may be compared to log-type keys 62 of the cache segments 300. A cache segment 300, if any, that has the same log-type key 62 as the query is identified as containing relevant messages. For any log type in the query that does not match a cache segment 300, as determined at block 344, the regular segments 160 are considered, at block 346.

The log types of the query are processed, as per blocks 342-346, until the query is completed, via block 348.

In view if the above, it should be apparent that these techniques provide for efficient and fast compression, searching, and decompression of log messages. Compressed log messages may be searched without first being decompressed. Further, no access to the program that generated the log messages is needed. Log messages may be processed directly and without advanced knowledge of their format.

Tests were conducted on a system constructed according to the techniques discussed herein. The results of the tests were compared to conventional techniques.

The tests used a server with i) two Intel Xeon™ E5-2630V3 2.4 GHz CPUs, comprising a total of 16 cores (32 threads), ii) 256 GB of DDR4 RAM, and iii) a 3 TB 7200 RPM hard drive. Elasticsearch™ 7.8.0, released in June, 2020, was used. All tests were run on a system as discussed herein and Elasticsearch from hard drive storage.

To compare Elasticsearch and the present system both tools were configured with equivalent parameters. To store a message timestamp, its content, and the path of the file that contained the message, as discussed herein, Elasticsearch was configured with an index that defined these fields and their types.

An Elasticsearch 'text' type was assigned to the 'message' field, so that it can be searched with substrings, just as in the present system. An Elasticsearch 'keyword' type was assigned to the 'path' field since it does not require substring searches. Finally, an Elasticsearch 'date' type was assigned to the 'timestamp' field so that Elasticsearch can perform timestamp queries.

The Elasticsearch deployment was configured to closely match the present system's deployment. First, Elasticsearch was configured with a dedicated master node, matching the present system. However, the present system's and Elasticsearch's slave processes differed in that the present system was implemented to use one or more single-threaded processes to perform searches whereas Elasticsearch used one or more multi-threaded processes. The number of threads in each Elasticsearch slave process (a data node) was determined by the number of 'shards' configured in an index. As a result, Elasticsearch was configured with a single data node, and to vary the number of threads in the evaluation, the number of shards was varied. The number of search processes was varied in the present system. During ingestion, all log data was sent directly to this data node to avoid unnecessary data shuffling from the master to the data node. Finally, as a Java application, Elasticsearch required a user-specified heap size. The Java virtual machine allocated this heap when the program was started. In contrast, the present system was implemented as a C++ application that allocated memory on-demand. Thus, to match the maximum memory utilization of the two tools, Elasticsearch's heap size was set to the maximum amount of memory the present system used for a given number of threads.

Figures 14, 15, 16:
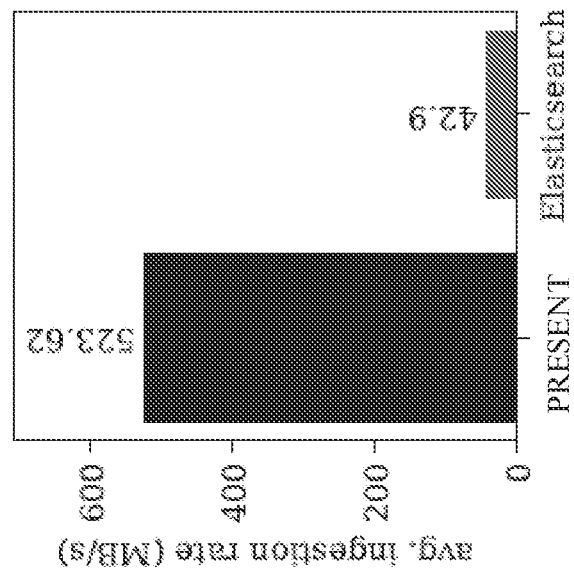
FIG. 14 is a table showing logs tested.
FIG. 15 is a table showing ingestion test results.
FIG. 16 is a table showing comparative compression test results.

FIG. 14 lists the datasets used in the evaluation and their characteristics. The Hadoop™ datasets were generated by a Hadoop cluster running workloads from the HiBench™ benchmark suite. The hadoop-258 GB dataset was a subset of the hadoop-14 TB dataset. Lastly, the openstack-24 hrs dataset was generated by an OpenStack™ cluster running a few VM™ management operations for 24 hours.

The present system's and Elasticsearch's ingestion performance was evaluated by comparing the rate at which they ingested the hadoop-30 GB dataset from a RAM disk. Logs were read from a RAM disk to measure the performance limit of Elasticsearch and the present system.

In order to ingest log files into Elasticsearch, a log parser that parses the fields described herein was needed. The Elasticsearch suite contains two applications that can do this—Logstash and Filebeat. Filebeat was used. However, no configuration was found to achieve an ingestion rate beyond 1 MB/s.

The log parser of the present system was connected to Elasticsearch to provide the best performance. Since Elasticsearch also supported ingestion through a REST API, the present system's log parser was used to send logs to Elasticsearch. In this case, the parser simply accumulated several parsed messages and then sent them to Elasticsearch when a buffer was full. Two buffers were used to allow accumulation to continue while one buffer was being sent to Elasticsearch. The present system's parser was able to achieve a better ingestion rate than Filebeat.

The ingestion performance results are shown in FIG. 15. The Elasticsearch deployment using the present system's parser resulted in an average ingestion rate of 42.90 MB/s when both the parser and Elasticsearch's data node used 32 threads (32 shards). In contrast, the present system achieved an average ingestion rate of 523.62 MB/s when configured with 32 threads—a rate 12.4 times higher than Elasticsearch. Any fewer or more threads resulted in a performance decline both in the case of the present system and Elasticsearch.

These results indicate that log data will be ready to be searched much faster when using the present system as compared to Elasticsearch, enabling the present system to be used as a real-time search tool. In the present system, the ingestion involves compressing the log data, whereas for Elasticsearch it involves indexing log data. The log data is ready for search after ingestion for both the present system and Elasticsearch.

The present system, gzip™, and Elasticsearch's compression ratio were evaluated on the datasets described by FIG. 14. Note that although Elasticsearch is primarily designed to index and search data, it does compress indexed data with an LZ4 algorithm by default. The compression ratios for each dataset using the three tools are listed in FIG. 16 as a percentage representing the size of compressed data divided by the raw data size. The last column shows the difference between the compression ratios of the present system and Elasticsearch. Results for Elasticsearch on the hadoop-14 TB dataset are omitted because the storage and ingestion time required by Elasticsearch exceeded the scope the evaluation. Instead, the subset hadoop-258 GB may be referenced.

On average, the present system compresses the log data to 3.08% of its original size, compared to 37.93% for Elasticsearch. As can be seen, the present system's compression ratio is an order of magnitude better (11.8×) compared with Elasticsearch, translating to a significant saving in storage costs. The present system's compression ratio is even better than gzip, which only compresses the raw data to 5.30% of its original size. Further, the present system has the ability to search this compressed data whereas gzip does not. These results also show that as the dataset grows larger, the present system's improvement over the other tools grows larger as well.

The present system's and Elasticsearch's search performance was evaluated using a benchmark of queries meant to exercise different parts of the present system's implementation. The queries are listed in FIG. 17 and are specific to the hadoop-258 GB dataset.

Queries without variables as well as queries with different types of variables were used to exercise different aspects of the present system's implementation that search for log types and variables, respectively. To measure scalability, each category of query included one that returns a few results and one or more queries that returned many results. For these experiments, the present system's query cache was configured to cache log types that had no more than one million messages (around 0.01% of all logs in the dataset). This increased the size of compressed log by approximately 0.01% per cached log type. This has a negligible effect on compression ratio while offering better search performance.

Note that, in FIG. 17, the quotation marks in each query are used to highlight any leading or trailing spaces and are not part of the query. The "best search runtime" column lists the lowest runtime for a query across all number of threads evaluated. The number in parentheses is the speedup of the present system relative to Elasticsearch. For the present system the performance with and without the query cache enabled is reported. Note that for queries 3-7, the present system did not cache results as the queries did not meet the caching criteria.

To ensure that the present system and Elasticsearch were comparable in the search performance evaluation, queries that return the same results from both tools were chosen.

Each query was benchmarked using the following experimental procedure:
1. The machine's file system cache is cleared; this is to simulate the effect of searching for cold data.
2. The system being tested (the present system or Elasticsearch) is started.
3. The query is run.
4. The query's completion time and resource usage are recorded.
5. The system is stopped.

This procedure was repeated ten times for each query and the average of all runs was reported. In addition, each experiment was run for 1, 2, 4, 8, 16, and 32 threads. Note that Elasticsearch handled each shard with one thread whereas each thread in the present system was capable of processing multiple archives. Nevertheless, to provide a fair comparison between the tools, the dataset was compressed into as many archives as there were threads.

The present system was evaluated in two additional configurations that improved the performance of loading the dictionaries in each archive. In one configuration, the dictionaries were stored on an SSD. In another configuration, the dictionaries were preloaded into memory when the present system was started. Since the size of dictionaries was no more than 0.5% of the total size of compressed logs, these configurations may allow users to achieve better search performance without sacrificing a significant amount of costly resources.

The results of the benchmark are summarized in the last three columns in FIG. 17. The present system is faster than Elasticsearch in 5 out of the 10 queries even without the query cache. Generally, for queries with a large number of results, the present system is faster. In addition, Elasticsearch tends to perform worse with more threads whereas the present system performs well with more than one thread, indicating the present system has better scalability. Overall, with preloaded-dictionaries, the present system is an average of 15.5× faster than Elasticsearch for this set of benchmark queries when the present system's query cache is enabled, and it is still 1.4× faster than Elasticsearch without using its query cache.

In the other 5 queries, the present system (without the query cache) is slower than Elasticsearch because Elasticsearch works by indexing the log data, and attempts to serve the queries entirely from its index without accessing the raw data. Furthermore, these queries tend to have a small number of results, making some of them ideal candidates for caching. Indeed, as shown in FIG. 17, by enabling the present system's query cache, queries 8, 9, and 10 return in 0.26 s, 0.58 s, and 0.25 s, which is respectively 77.1×, 3.1×, and 7.3× faster than Elasticsearch.

In general, these results show that the present system can achieve comparable performance compared to Elasticsearch even when it saves 11.8× of the storage cost (FIG. 16).

It was also found that storing the present system's dictionaries on SSD improves search performance by 2.66%-26.08% as the number of threads is increased from 1 to 32. Similarly, preloading the dictionaries improves performance by 15.12%-27.33% as the number of threads is increased. Thus, the present system's search performance can be moderately improved by using either an SSD or some memory.

It should be recognized that features and aspects of the various examples provided above can be combined into further examples that also fall within the scope of the present disclosure. In addition, the figures are not to scale and may have size and shape exaggerated for illustrative purposes.

We claim:

1. A non-transitory computer-readable medium comprising instructions to:
   receive a query to search a plurality of compressed log messages;
   generate subqueries based on the query, each of the subqueries being:
      a non-numeric expression subquery that is executable on a non-numeric expression dictionary that stores non-numeric expressions of variables;
      a log-type subquery that is executable on a log-type dictionary that stores log information that excludes expressions of variables and numeric values; or
      a numeric subquery that is executable on the plurality of compressed log messages that reference the log-type dictionary;
   execute the subqueries; and
   output a collection of results of the execution of the subqueries.

2. The non-transitory computer-readable medium of claim 1, wherein the query comprises a search phrase, and wherein the instructions are further to generate multiple different subqueries from the search phrase.

3. The non-transitory computer-readable medium of claim 1, wherein the instructions are to execute a numeric subquery by:
   identifying, in the log-type dictionary, log-type keys that correspond to log information that contains numeric placeholders;
   identifying a subset of the plurality of compressed log messages that contain the log-type keys; and
   comparing a value of the numeric subquery to values stored in the subset of the plurality of compressed log messages.

4. The non-transitory computer-readable medium of claim 1, wherein the plurality of log messages is divided into a plurality of segments;
   the non-numeric expression dictionary correlates the non-numeric expressions of variables to the plurality of segments;
   the log-type dictionary correlates the log information to the plurality of segments; and the instructions are further to match a subquery to a non-numeric expression in the non-numeric expression dictionary or a log-type in the log-type dictionary and limit further processing of the subquery to a subset of the plurality of segments correlated to the non-numeric expression or the log-type.

5. The non-transitory computer-readable medium of claim 1, wherein the instructions are further to combine the subqueries using a logical operator.

6. The non-transitory computer-readable medium of claim 1, wherein the instructions are further to generate different subqueries based on different interpretations of a token containing a wildcard.

* * * * *